(12) United States Patent
Atcitty et al.

(10) Patent No.: US 9,009,640 B1
(45) Date of Patent: Apr. 14, 2015

(54) AUTOMATIC COMPUTATION OF TRANSFER FUNCTIONS

(71) Applicant: Sandia Corporation, Albuquerque, NM (US)

(72) Inventors: Stanley Atcitty, Albuquerque, NM (US); Luke Dale Watson, Savannah, MO (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/921,110

(22) Filed: Jun. 18, 2013

(51) Int. Cl.
*G06F 17/50* (2006.01)

(52) U.S. Cl.
CPC ........ *G06F 17/5009* (2013.01); *G06F 17/5072* (2013.01)

(58) Field of Classification Search
USPC .......................................... 716/100, 106, 113
See application file for complete search history.

(56) References Cited

U.S. PATENT DOCUMENTS

| | | | |
|---|---|---|---|
| 3,973,112 A | | 8/1976 | Sloane |
| 5,404,319 A | * | 4/1995 | Smith et al. ................... 716/103 |
| 5,444,358 A | * | 8/1995 | Delepaut ........................ 323/222 |
| 5,689,685 A | * | 11/1997 | Feldmann et al. ................. 703/2 |
| 6,498,498 B1 | * | 12/2002 | Menezes et al. ............... 324/613 |
| 7,373,289 B2 | * | 5/2008 | McGaughy et al. ............ 703/14 |
| 7,454,300 B2 | * | 11/2008 | Suaya et al. .................... 702/65 |
| 7,552,159 B2 | | 6/2009 | Gay-Bellile et al. |
| 8,185,853 B2 | * | 5/2012 | Kim et al. ..................... 716/107 |
| 8,219,374 B1 | * | 7/2012 | Batarseh et al. ................ 703/13 |
| 2005/0154315 A1 | | 7/2005 | Nair et al. |
| 2005/0186915 A1 | * | 8/2005 | Williams .................... 455/67.11 |
| 2008/0288201 A1 | | 11/2008 | Oettinger et al. |

OTHER PUBLICATIONS

Wasynczok, et al; "Automated State Model Generation Algorithm for Power Circuits and Systems," IEEE Transactions on Power Systems, vol. 11, No. 4, Nov. 1996, pp. 1951-1956.

* cited by examiner

*Primary Examiner* — Sun Lin
(74) *Attorney, Agent, or Firm* — Daniel J. Jenkins

(57) ABSTRACT

Technologies pertaining to the automatic computation of transfer functions for a physical system are described herein. The physical system is one of an electrical system, a mechanical system, an electromechanical system, an electrochemical system, or an electromagnetic system. A netlist in the form of a matrix comprises data that is indicative of elements in the physical system, values for the elements in the physical system, and structure of the physical system. Transfer functions for the physical system are computed based upon the netlist.

20 Claims, 13 Drawing Sheets

AUTOMATIC COMPUTATION OF TRANSFER FUNCTIONS

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

Systems that include electronic elements (e.g., resistors, capacitors, inductors, voltage sources, etc.) and mechanical elements (e.g., springs, levers, oscillating arms, etc.) can be difficult to analyze. An exemplary method for analyzing such a system includes the derivation of transfer functions of the system, wherein the transfer functions can be employed in connection with finding electronic or mechanical resonant frequencies of the system, as well as in connection with designing, optimizing, and/or validating controllers used in the system.

Deriving transfer functions of a system that includes electronic and/or mechanical elements, however, is nontrivial. An exemplary approach for deriving transfer functions of a system is to estimate an input to the system (e.g., selecting a first mathematical function that represents a controlled source of energy) and also estimating the output of the system (e.g., selecting a second mathematical function that is believed to represent the output of the system). Based upon the estimated system input and system output, the transfer functions of the system can be derived. Estimating the system input and system output, however, is often associated with inaccuracies. For instance, a conventional approach for estimating input and output of a system involves simulation of the system in the time domain, wherein the input to the system is modified during simulation and corresponding output of the system is recorded. The simulated system input and output are then subjected to transformations to generate frequency domain signals. Transfer functions (in the frequency domain) of the simulated system are then computed based upon the frequency domain signals corresponding to the simulated input and simulated output.

This conventional approach, however, suffers from various deficiencies. First, simulating operation of the system is a nontrivial task, and typically requires a user that is performing such simulating to have a relatively large amount of knowledge about the system to ensure that the system remains stable during simulation. Additionally, a relatively large amount of simulation needs to be performed to compute transfer functions accurately. The process of simulation and conversion from the time domain to the frequency domain is computationally expensive, and can take several days for relatively complex systems using conventional computing devices. Additionally, if the system is modified (e.g., if an element is added, removed, or modified), the entire process must be repeated.

SUMMARY

The following is a brief summary of subject matter that is described in greater detail herein. This summary is not intended to be limiting as to the scope of the claims.

Described herein are various technologies pertaining to the automatic derivation of transfer functions of an electrical, mechanical, electromechanical, electrochemical, or an electromagnetic system (e.g., a physical system) without requiring simulation of input and output of the system. In an exemplary embodiment, a computer-implemented tool is provided that facilitates receipt of a schematic diagram of a system whose transfer functions are desirably derived. For instance, through utilization of the computer-implemented tool, a user can draw the system. Accordingly, a library of selectable system elements (e.g., resistors, capacitors, inductors, voltage sources, current sources, amplifiers, controller blocks, springs, etc.) can be provided, and the user can draw the physical system by selecting and placing physical system elements from the library relative to one another in a desired manner. Further, the user can set forth values that describe parameters of each element in the physical system. Thus, the user can draw a physical system that includes a resistor, and the user can set forth a resistance value for the resistor.

A netlist can then be formed based upon the schematic of the physical system set forth by the user, wherein the netlist is representative of the physical system and includes data that is indicative of types of elements and respective values for the elements included in the physical system, as well as locations of elements in the physical system relative to locations of other elements in the physical system. Further, in an example, for a relatively complex physical system where an energy source is subjected to control, a plurality of netlists can be generated for the physical system, including netlists that describe subsystems in the physical system (e.g., circuits in the system) and a system-level netlist that describes control systems and interactions between the subsystems in the physical system. The computer-implemented tool can additionally receive at least one frequency value with respect to which the physical system is desirably analyzed. The computer-implemented tool can then compute transfer functions of the physical system responsive to receiving the netlist and the at least one frequency value. With more particularity, the computer-implemented tool can compute the transfer functions based upon the data that is indicative of the types of the elements, the values for the elements, and relative locations of the elements in the physical system with respect to one another as set forth in a subsystem netlist and/or system level netlist. The transfer functions computed by the computer-implemented tool can be one of an input-to-output transfer function, a control-to-output transfer function, an input impedance transfer function, or an output impedance transfer function. Further, it is to be noted that the transfer function can take into consideration operation of the control circuit in the physical system.

The computed transfer functions may then be employed in connection with analyzing the physical system in operation, designing the physical system, optimizing controls for the system, and the like. Pursuant to an example, it may be desirable to analyze perturbations experienced by an energy storage device that is coupled to an electric grid, and accordingly it may be desirable to analyze operation of circuitry that couples the energy storage device to the electric grid. Using the computer-implemented tool, transfer functions for the aforementioned circuitry can be computed for specified frequencies (as well as direct current transfer functions). A spectrum analyzer can be utilized to obtain inputs to the circuitry, and frequencies observed in the output of the spectrum analyzer can be provided as input to the transfer functions. The output of the transfer functions can be analyzed to ascertain perturbations that reach the energy storage system. Through identifying and understanding perturbations that reach the energy storage system, modifications to the circuitry and/or control system can be made to optimize the energy storage system and/or extend the life of the energy storage system.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
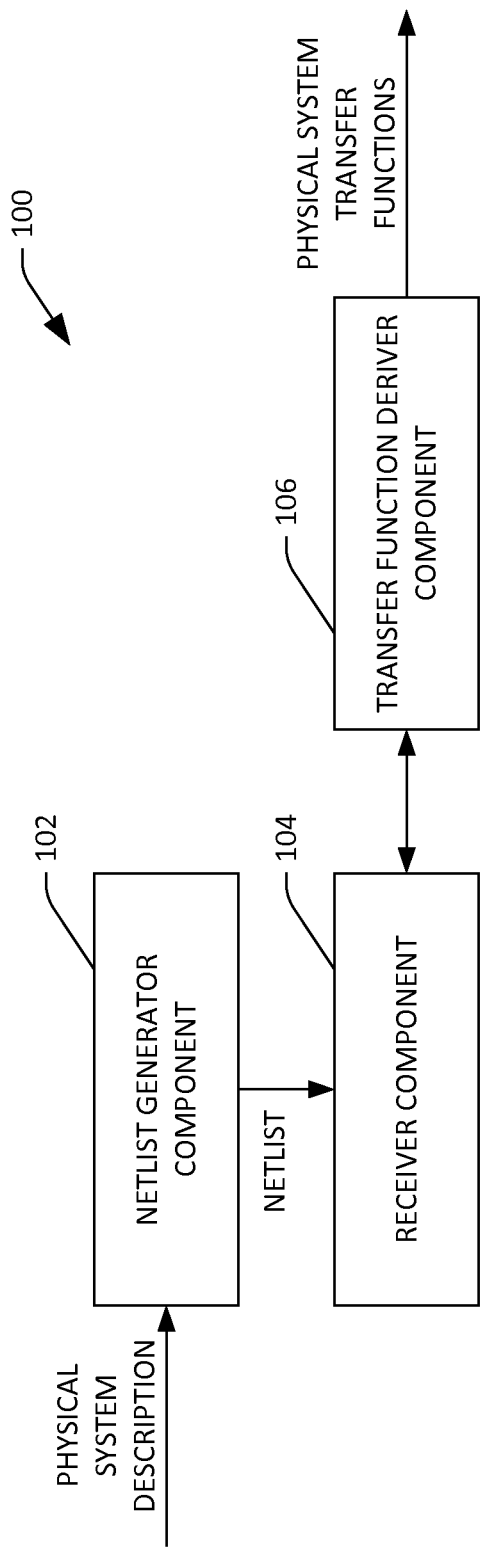
FIG. 1 is a functional block diagram of an exemplary computer-implemented tool that facilitates automatically deriving transfer functions of a physical system.

Various technologies pertaining to deriving transfer functions of a physical system are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "tool" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference now to FIG. 1, an exemplary computer-implemented tool 100 that facilitates automatically deriving transfer functions of a physical system is illustrated. As used herein, the term "physical system" refers to an electrical system, a mechanical system, an electromechanical system, an electrochemical system, and/or an electromagnetic system.

The tool 100 optionally includes a netlist generator component 102 that receives a description of the physical system from a user and automatically generates a netlist that describes the physical system based upon the description received from the user. Pursuant to an example, a computer-implemented graphical user interface can be provided to the user that is employable by the user to generate a schematic diagram of a physical system whose transfer functions are desirably derived. For instance, the graphical user interface can provide the user with a blank canvas to place and connect "blocks" that represent respective elements of the physical system. Electrical system blocks can represent inductors, capacitors, resistors, voltage sources, current sources, etc. Mechanical system blocks can represent weights, springs, inertia, etc. Further, blocks can be representative of portions of a controller, such as gains, summations, etc. Additionally, blocks can be connected together to represent systems with coupled electrical and mechanical elements. Likewise, blocks can be representative of chemical and/or electrochemical elements, such as photovoltaic cells, piezoelectric elements, etc. For purposes of explanation, examples described herein pertain to electrical systems that include electrical elements. It is to be understood, however, that the hereto-appended claims are not to be limited to electrical systems.

As indicated above, the netlist generator component 102 can receive the schematic of the physical system set forth by the user and can automatically generate a netlist responsive to receiving such schematic. The netlist comprises data that is indicative of types of elements of the physical system and structure of the physical system (e.g., position of elements with respect to one another in the physical system). With more specificity, the netlist computed by the netlist generator component 102 can be formed as a matrix, wherein each row of the matrix includes data that is indicative of a type of a respective element, nodes to which the respective element is attached, and a value for the respective element. Furthermore, the netlist generator component 102 can arrange rows in the matrix such that certain element types are placed in the netlist at particular positions relative to other element types. For instance, with respect to an electrical system, voltage sources can be positioned in uppermost rows of the netlist, while current sources can be positioned in lowermost rows of the netlist.

The tool 100 further includes a receiver component 104 that receives the netlist. In an example, the receiver component 104 can receive the netlist from the netlist generator component 102. In another exemplary embodiment, however, the receiver component 104 can receive the netlist directly from the user. The tool 100 also comprises a transfer function deriver component 106 that is in communication with the receiver component 104 and automatically derives transfer functions for the physical system based upon the netlist. Additionally, while not shown, the transfer function deriver component 106 can receive an indication of frequencies with respect to which transfer functions of the system are desirably derived. Therefore, if the user is interested, for instance, in ten particular harmonics of the physical system, the user can specify such ten harmonics and the transfer function deriver component 106 can generate transfer functions for the physical system with respect to the identified harmonics.

Figure 2:
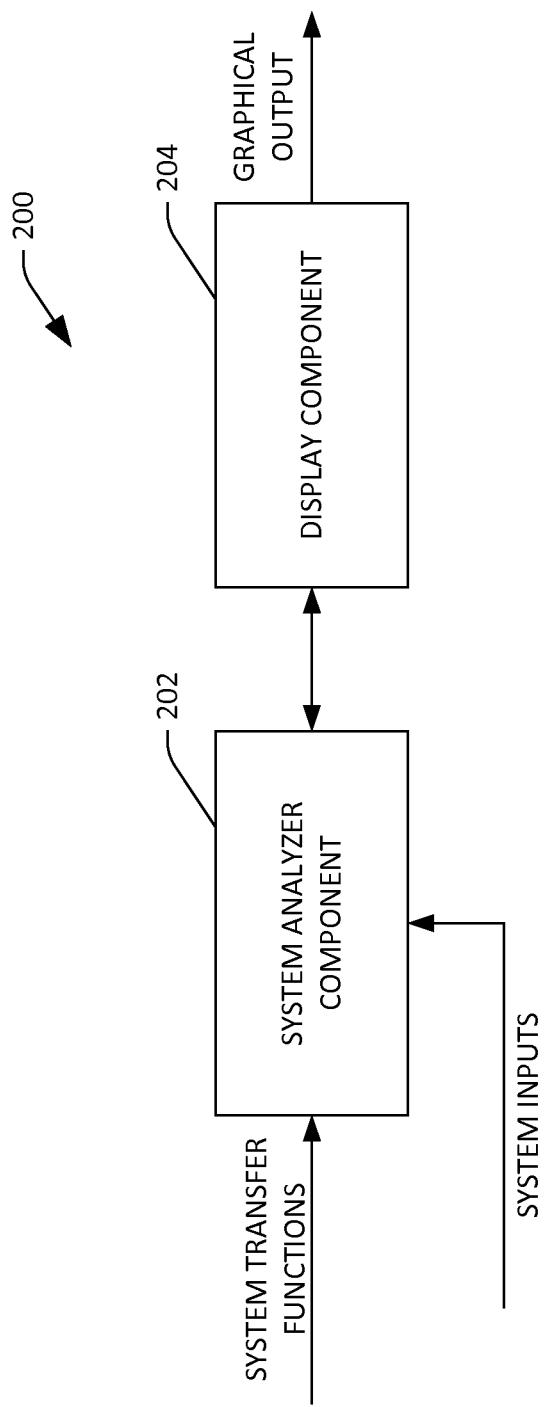
FIG. 2 is a functional block diagram of an exemplary computer-implemented tool that facilitates analyzing operation of a physical system based upon transfer functions derived for the physical system.

With reference now to FIG. 2, an exemplary tool 200 that facilitates analysis of the aforementioned physical system is illustrated. The tool 200 comprises a system analyzer component 202 that receives the system transfer functions derived by the transfer function deriver component 106. The system analyzer component 202 further receives exemplary inputs to the physical system. Such inputs can be theoretical in nature, such that operation of the physical system can be simulated. In another exemplary embodiment, for a physical system that is deployed, the user can acquire input frequency characteristics of such system (e.g., through use of a spectrum analyzer) and can provide such input frequency characteristics to the system analyzer component 202.

The system analyzer component 202 can utilize the system transfer functions and the physical system inputs to solve for outputs of the physical system (e.g., based upon the inputs). Thus, the system analyzer component 202 can output data in the frequency domain that is indicative of output of the desirably analyzed physical system. Such output data may be indicative of resonance frequency of the physical system or other perturbations output by the physical system.

A display component 204 is in communication with the system analyzer component 202. The display component 204 generates graphical output that is indicative of operation of the physical system when provided with the above-noted physical system inputs. For example, the graphical output can indicate whether the physical system outputs energy at a particular frequency, magnitude of energy output at such frequency, etc., for specified system inputs. Such graphical output may be in the form of text, a graph that is indicative of frequencies and/or magnitudes output by the physical system, etc.

Figure 3:
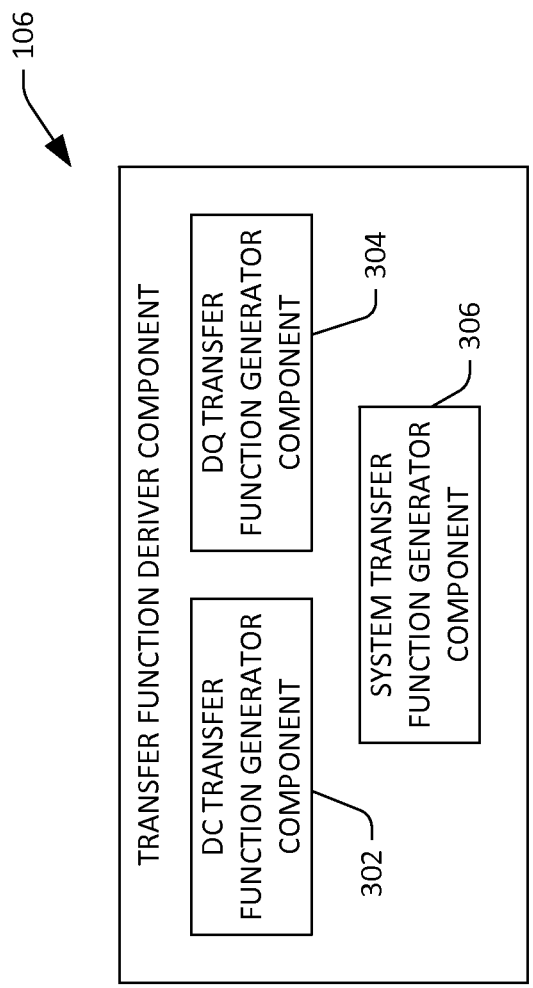
FIG. 3 is a functional block diagram of an exemplary component that facilitates derivation of transfer functions for a physical system.

Now turning to FIG. 3, an exemplary depiction of the transfer function deriver component 106 is illustrated. The transfer function deriver component 106 includes a DC transfer function generator component 302, a direct-quadrature (DQ) transfer function generator component 304, and a system transfer function generator component 306. As will be described in greater detail below, with respect to an electrical system, the DC transfer function generator component 302 can generate DC transfer functions for low-level circuits in the physical system, and the DQ transfer function generator component 304 can generate DQ transfer functions for the low-level circuits at specified frequencies, wherein a DQ rotating reference frame is employed. Thus, each DQ transfer function output by the DQ transfer function generator component 304 describes the input to output relationship of an alternating current component and phase of a signal at a specified frequency.

The system transfer function generator component 306 can generate high-level system transfer functions that take into consideration how control systems and circuits interact with one another. As indicated previously, the transfer function deriver component 106 can receive a high-level system netlist which can indicate whether a voltage and/or current source is a constant voltage and/or current source or a control voltage and/or current source. A type of control system use can be described in the high-level system netlist. Based upon such high-level system netlist, the system transfer function generator component 306 can generate system-level transfer functions for the physical system. Operation of the transfer function deriver component 106 will now be described in greater detail.

Figure 4:
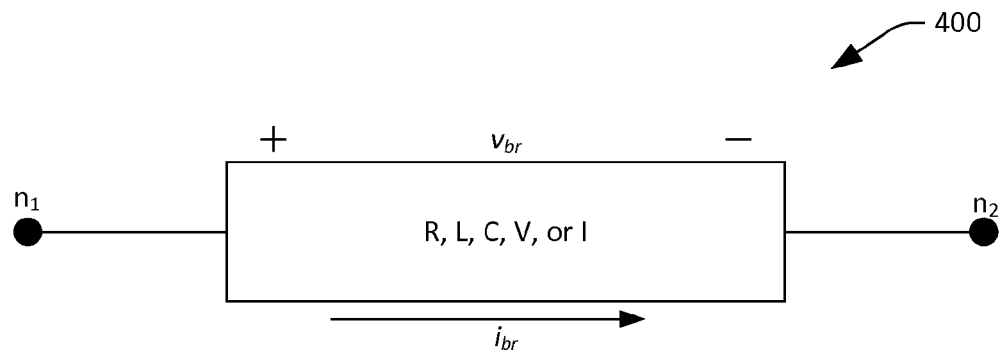
FIG. 4 illustrates an exemplary branch of a physical system.

With reference now to FIG. 4, an exemplary branch 400 of an electrical system is illustrated. It can be understood that a periodic signal can be represented as follows:

$$x = x_{dc} + \sum_{i=1}^{m} [x_d \cos(\omega nt) - x_q \sin(\omega nt)] \quad (1)$$

Eq. (1) is essentially a Fourier series representation of a signal. Each state can be separated into a direct current (DC) portion ($x_{dc}$), sum of d-axis portions ($x_d \cos(\omega nt)$), and a sum of q-axis portions ($-x_q \sin(\omega nt)$). This separation involves $2(N_{max}+1)M$ different equations, where $N_{max}$ is a number of harmonics to be analyzed and M is a number of states in the physical system.

Generating low-level circuit transfer functions, then, is a two-step process. First, the DC transfer function generator component 302 generates DC transfer functions for the circuit. Thereafter, the DQ transfer function generator component 304 generates the DQ transfer functions for the circuit.

To generate the DC circuit transfer functions, equations in the following form can be derived:

$$x = A_{tf} x + B_{tf} u \quad (2)$$

where u represents inputs to the circuit and x represents outputs of the circuit. Solving for x yields the following:

$$x = (I - A_{tf})^{-1} B_{tf} u \quad (3)$$

The DC transfer function generator component 302 computes $A_{tf}$ and $B_{tf}$ from the above mentioned netlist. Eq. (2) can be further broken down as follows:

$$
\begin{bmatrix}
i_{y(n-1,1)} \\
i_{x(b-n+1,1)} \\
v_{x(n-1,1)} \\
v_{y(b-n+1,1)}
\end{bmatrix}
=
\begin{bmatrix}
0_{(n-1,n-1)} & -\hat{A}_{(n-1,b-n+1)} & 0_{(n-1,n-1)} & 0_{(n-1,b-n+1)} \\
0_{(b-n+1,n-1)} & 0_{(b-n+1,b-n+1)} & 0_{(b-n+1,n-1)} & E_{(b-n+1,b-n+1)} \\
F_{(n-1,n-1)} & 0_{(n-1,b-n+1)} & 0_{(n-1,n-1)} & 0_{(n-1,b-n+1)} \\
0_{(b-n+1,n-1)} & 0_{(b-n+1,b-n+1)} & \hat{A}^T_{(b-n+1,n-1)} & 0_{(b-n+1,b-n+1)}
\end{bmatrix}
\begin{bmatrix}
i_{y(n-1,1)} \\
i_{x(b-n+1,1)} \\
v_{x(n-1,1)} \\
v_{y(b-n+1,1)}
\end{bmatrix}
+
$$

$$
\begin{bmatrix}
0_{(n-1,ni)} & 0_{(n-1,nv)} \\
b_{i(b-n+1,ni)} & 0_{(b-n+1,nv)} \\
0_{(n-1,ni)} & b_{v(n-1,nv)} \\
0_{(b-n+1,ni)} & 0_{(b-n+1,nv)}
\end{bmatrix}
\begin{bmatrix}
u_{(ni,1)} \\
u_{(nv,1)}
\end{bmatrix}
\quad (4)
$$

where the values in ( )'s give the dimension of each matrix, n is the number of nodes, b is the number of branches, nv is the number of voltage sources, and ni is the number of current sources.

The DC transfer function generator component 302 can generate Â based upon the netlist describing the circuit. Each row of the netlist represents a branch of the circuit, such as the branch 400 illustrated in FIG. 4. For purposes of explanation, at the circuit level, each branch can represent a single element, such as, a resistor, an inductor, a capacitor, a voltage source, or a current source. Accordingly, each row of the netlist includes 1) a type of the branch 400 (R, L, C, V or I), 2) the node to which the positive terminal of the branch 400 is connected (e.g., node $n_2$), the node to which the negative terminal of the branch 400 is connected (e.g., node $n_1$), a value for the branch 400, and a name of the branch 400.

Figure 5:
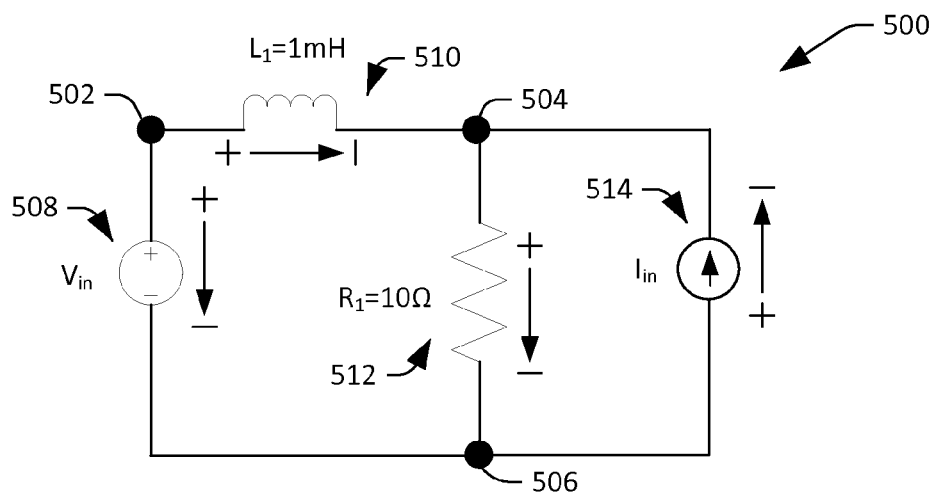
FIG. 5 illustrates an exemplary circuit for which a transfer function can be derived.

FIG. 5 illustrates an exemplary circuit 500 which includes nodes 502, 504 and 506, and branches 508, 510, 512, and 514. The nodes 502, 504, and 506 are referred to as nodes 1, 2, and 3, while the branches 508, 510, 512, and 514 are referred to branches 1, 2, 3, and 4. An exemplary netlist N for the circuit 500 is set forth below.

$$N = \begin{bmatrix} type & n_1 & n_2 & value & name \\ V & 1 & 3 & 1 & \text{``Vin''} \\ L & 1 & 2 & 1e-3 & \text{``L1''} \\ R & 2 & 3 & 10 & \text{``R1''} \\ 1 & 3 & 2 & 2 & \text{``Iin''} \end{bmatrix} \begin{matrix} 1 \\ 2 \\ 3 \\ 4 \end{matrix} \text{Branch \#}$$

Values for the voltage sources and current sources in the netlist are used to specify the order that the inputs appear in the transfer functions matrix of Eq. (3). Prior to processing the netlist, voltage sources can be placed at the top of the netlist and current sources can be placed at the bottom of the netlist. Arrangement of rows of the netlist can be performed by the netlist generator component 102 based upon a schematic of the circuit 500 set forth by the user. Alternatively, the user can arrange contents of the netlist in accordance with pre-specified rules, wherein voltage sources are located at the top and current sources at the bottom of the netlist.

Referring to the exemplary netlist N above, the DC transfer function generator component 302 can generate the node incident matrix $A_a$, wherein each column in $A_a$ corresponds with a branch in N. Further, each row in $A_a$ corresponds with a node in N. If the positive (negative) terminal of the ith branch of N is on node j, then $A_{a(i,j)}=1$ ($A_{a(i,j)}=-1$). The DC transfer function generator component 302 can set all other entries in $A_a$ to 0. Based upon the exemplary netlist N set forth above, the DC transfer function generator component 302 can generate $A_a$ to be the following:

$$A_a = \begin{bmatrix} 1 & 1 & 0 & 0 \\ 0 & -1 & 1 & -1 \\ -1 & 0 & -1 & 1 \end{bmatrix} \begin{matrix} 1 \\ 2 \\ 3 \end{matrix} \text{node \#}$$

branch #: 1 2 3 4

Placing $A_a$ in reduced row echelon form yields $\tilde{A}_a$, which has a form as follows:

$$\tilde{A}_a = \begin{bmatrix} I_{n-1,n-1} & \hat{A}_{n-1,b-n+1} \\ 0_{1,n-1} & 0_{1,b-n+1} \end{bmatrix} = \begin{bmatrix} 1 & 0 & 1 & -1 \\ 0 & 1 & -1 & 1 \\ \hline 0 & 0 & 0 & 0 \end{bmatrix} \quad (5)$$

Columns in Eq. (5) can be swapped to obtain the correct form if desired. If this occurs, corresponding branches (rows) in N can be swapped. The $\tilde{A}_a$ matrix in Eq. (5) gives the Â and $\hat{A}^T$ components of $A_{tf}$.

Â gives n−1 linearly independent Kirchhoff's current law (KCL) equations. Specifically, $i_y$ represents currents corresponding to the first n−1 branches in N, and $i_x$ represents the currents corresponding to the last b−n+1 branches in N. Given the foregoing and contents of Eq. (5), the following can be derived by the DC transfer function generator component 302:

$$i_y = -\hat{A} i_x, \quad (6)$$

which relates the dependent currents ($i_y$) to the independent currents ($i_x$). The DC transfer function generator component 302 can take the transpose of Â, and generate a set of b−n+1 linearly independent Kirchhoff's voltage law (KVL) in the form of:

$$v_y = \hat{A}^T v_x \quad (7)$$

which relates the dependent voltages ($v_y$) to the independent voltages ($v_x$). Using Eq. (6) and Eq. (7), b linearly independent equations are obtained. It can be understood that there must be 2b linearly independent equations, since the current and voltage are to be derived for each branch. The remaining b equations can be derived by the DC transfer function generator component 302 using branch constitutive equations, which are defined in E, F, $b_i$, and $b_v$ from Eq. (4). Equations for the independent variables ($i_x$ and $v_x$) can be derived programmatically by the DC transfer function generator component 302.

FIGS. 6-9 and 13-14 illustrate exemplary methodologies relating to computing transfer functions of a physical system. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Figure 6:
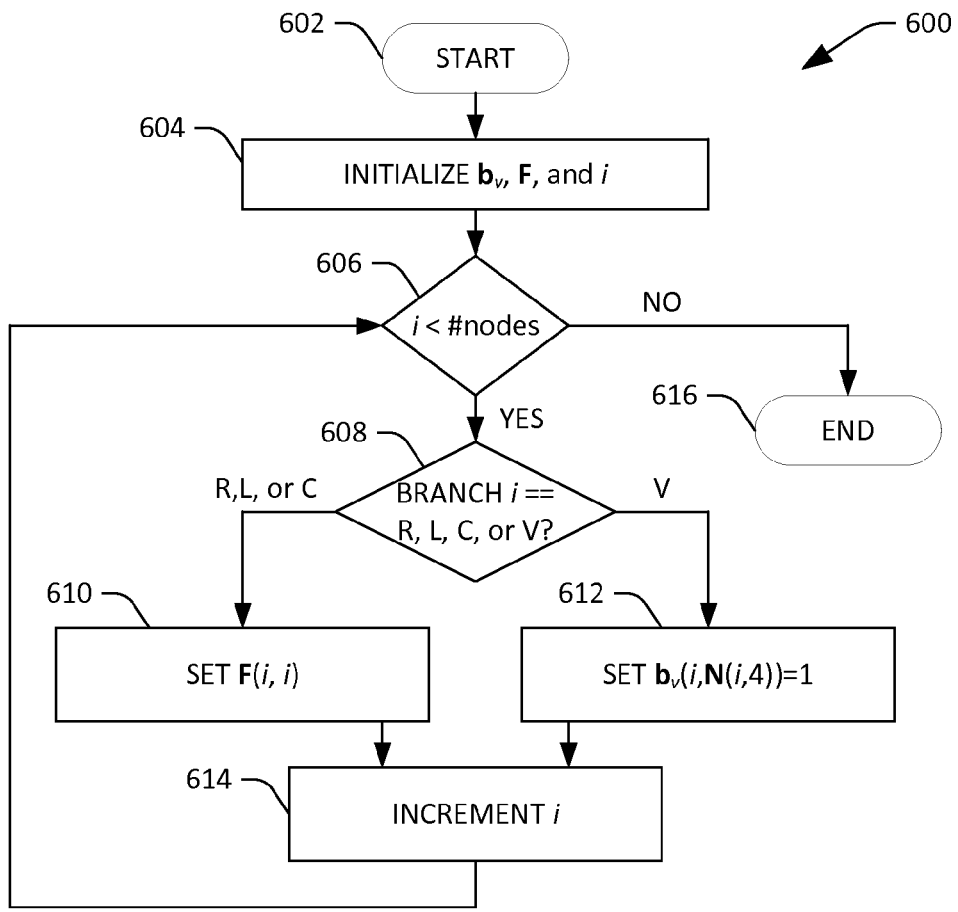
FIGS. 6-9 illustrate exemplary methodologies that can be used in connection with deriving transfer functions for a physical system.

Referring now to FIG. 6, an exemplary methodology 600 for defining F and $b_v$ that can be performed by the DC transfer function generator component 302 is illustrated. The methodology 600 maps the dependent currents $i_y$ to the independent voltages $v_x$. The methodology 600 starts at 602, and at 604 F, $b_v$, and i are initialized. In an exemplary embodiment, F and $b_v$ can be set to zero when initialized, and i can be set to one when initialized. At 606, a determination is made regarding whether i is less than the number of nodes in N. If i is less than the number of nodes in N, then the methodology 600 proceeds to 608, where a determination is made regarding whether branch i of N represents a resistor, inductor, capacitor, or voltage source. If it is determined that branch i represents a resistor, inductor, or capacitor, then the methodology 600 proceeds to 610, where F(i, i) is set. With more particularity, if the branch i represents a resistor, the ith diagonal entry of F is set to the resistive value of the branch. If the branch i represents an inductor, the ith diagonal entry of F is set to the impedance of the branch (sL). If the branch i represents a capacitor, the ith diagonal entry of F is set to the impedance of the branch (1/sC).

If at 608, it is determined that the branch i of N represents a voltage source, then the methodology 600 proceeds to 612, where $b_v(i,N(i,4))=1$. In other words, the ith row and the column corresponding to the voltage source of $b_v$ is set to 1. Subsequent to acts 610 or 612, at 614, i is incremented, and the methodology 600 returns to act 606. When it is determined at 606 that i is not less than the number of nodes in N, the methodology 600 completes at 616. Thus, if the netlist N follows the convention of ordering voltage source branches first and current source branches last, then there will be no current sources in the first n−1 branches.

Figure 7:
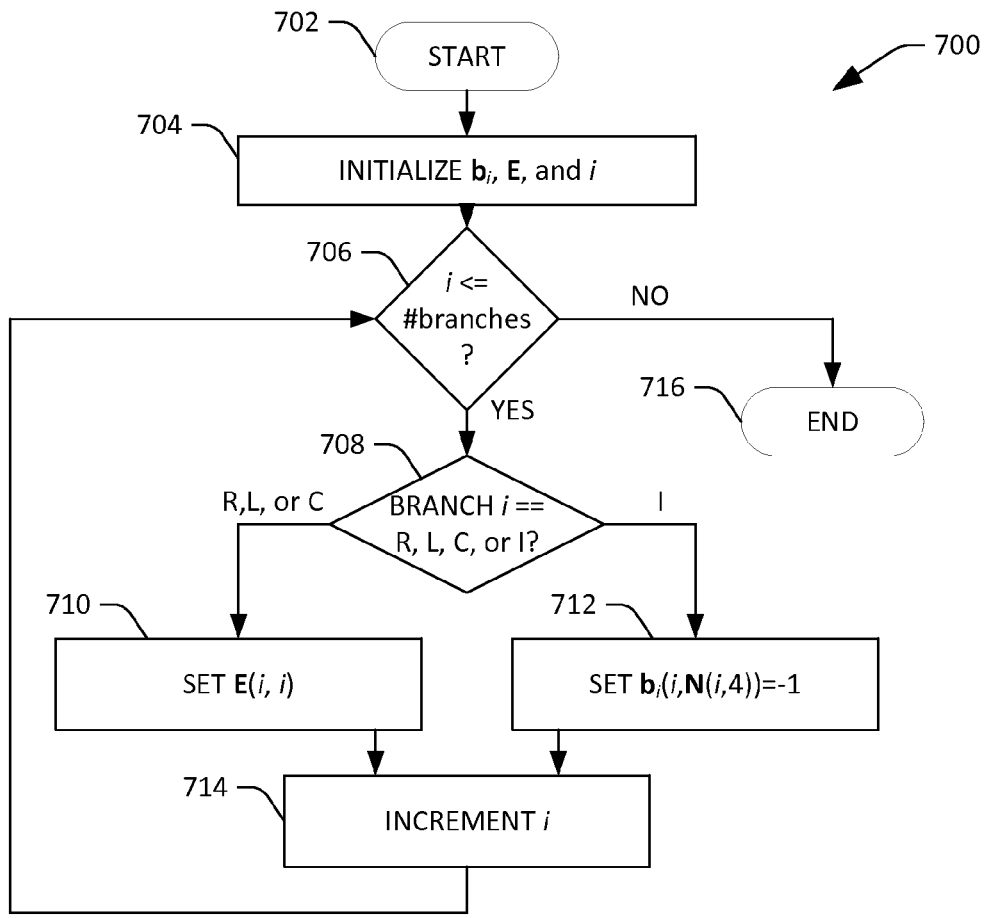

Turning now to FIG. 7, an exemplary methodology 700 that can be performed by the DC transfer function generator component 302 in connection with defining E and $b_i$ is illustrated. Equations E and $b_i$ map the dependent voltages $v_y$ to the independent currents $i_x$. The methodology 700 starts at 702, and at 704 E, $b_i$, and i are initialized. Pursuant to an example, E and $b_i$ can be set to zero when initialized, while i can be set to one. The last b−n+1 branches (rows) of the netlist N are parsed through by the methodology 700. At 706, a determination is made as to whether i is less than or equal to the number of branches in N. If it is determined at 706 that i is less than or equal to the number of branches in N, then the methodology 700 proceeds to 708, where a determination is made as to whether branch i in N represents a resistor, inductor, capacitor, or current source. If it is determined at 708 that branch i represents a resistor, inductor, or capacitor, then the methodology 700 proceeds to act 710, where a value for E(i, i) is set. With more particularity, if branch i of N represents a resistor, then the ith diagonal entry of E is set to the inverse of the resistive value of branch i. If the branch i of N represents an inductor, the ith diagonal entry of E is set to the admittance of branch i (1/sL). If the branch i of N represents a capacitor, the ith diagonal entry of E is set to the admittance of branch i (sC).

If it is determined at 708 that branch i corresponds to a current source, then the methodology 700 proceeds to 712, where $b_i$ is set by way of $b_i(i,N(i,4))=-1$. In other words, the ith row and the column corresponding to the current source of $b_i$ can be set to −1. Subsequent to act 710 or act 712, the methodology 700 proceeds to 714, where i is incremented. Thereafter, the methodology 700 returns to act 706. When i is found to be equal to the number of branches in N, the methodology completes at 716. If N follows the convention of ordering all voltage source branches first and all current source branches last, then an error case will not be encountered.

It can be ascertained that variables in Eq. (4) can be defined based upon the methodologies 600 and 700. The DC transfer function generator component 302 can then solve for DC transfer functions using Eq. (3), wherein such transfer functions can be in the following form:

$$\frac{x}{u} = \begin{bmatrix} \frac{i_1}{i_{in(1)}} & \frac{i_1}{i_{in(2)}} & \cdots & \frac{i_1}{i_{in(ni)}} & \frac{i_1}{v_{in(1)}} & \frac{i_1}{v_{in(2)}} & \cdots & \frac{i_1}{v_{in(nv)}} \\ \frac{i_2}{i_{in(1)}} & \frac{i_2}{i_{in(2)}} & & \frac{i_2}{i_{in(ni)}} & \frac{i_2}{v_{in(1)}} & \frac{i_2}{v_{in(2)}} & & \frac{i_2}{v_{in(nv)}} \\ \vdots & & \ddots & \vdots & \vdots & & \ddots & \vdots \\ \frac{i_b}{i_{in(1)}} & \frac{i_b}{i_{in(2)}} & & \frac{i_b}{i_{in(ni)}} & \frac{i_b}{v_{in(1)}} & \frac{i_b}{v_{in(2)}} & & \frac{i_b}{v_{in(nv)}} \\ \frac{v_1}{i_{in(1)}} & \frac{v_1}{i_{in(2)}} & \cdots & \frac{v_1}{i_{in(ni)}} & \frac{v_1}{v_{in(1)}} & \frac{v_1}{v_{in(2)}} & \cdots & \frac{v_1}{v_{in(nv)}} \\ \frac{v_2}{i_{in(1)}} & \frac{v_2}{i_{in(2)}} & & \frac{v_2}{i_{in(ni)}} & \frac{v_2}{v_{in(1)}} & \frac{v_2}{v_{in(2)}} & & \frac{v_2}{v_{in(nv)}} \\ \vdots & & \ddots & \vdots & \vdots & & \ddots & \vdots \\ \frac{v_b}{i_{in(1)}} & \frac{v_b}{i_{in(2)}} & \cdots & \frac{v_b}{i_{in(ni)}} & \frac{v_b}{v_{in(1)}} & \frac{v_b}{v_{in(2)}} & \cdots & \frac{v_2}{v_{in(nv)}} \end{bmatrix} \quad (8)$$

The numerator in each entry represents either the current through a branch or the voltage across the branch. The branch number can be specified by a subscript of the numerator (with b representing the number of branches in the circuit). The denominator in each entry can represent an input current or voltage. The input source number can be specified by the subscript and parentheses (with ni representing the number of current sources in the circuit and nv representing the number of voltage sources in the circuit).

As mentioned above, the DQ transfer function generator component 304 can derive transfer functions at the circuit level by using multiple reference frame theory, thereby allowing for a linear periodically time varying system to be accurately analyzed as a linear time invariant system. With more specificity, the DQ transfer function generator component 304 can generate circuit level transfer functions using the DQ rotating reference frame. Equations in DQ are used to model the AC component of each signal, and each DQ equation describes the input to output relationship of a signal at a specific frequency. For each frequency to be analyzed (e.g., as specified by a user), the DQ transfer function generator component 304 can generate a new equation in the form of Eq. (2). In generating DQ equations, the DQ transfer function generator component 304 can represent Eq. (2) as set forth below:

(9)

$$\begin{bmatrix} i_{dqy(2(n-1),1)} \\ i_{dqx(2(b-n+1),1)} \\ v_{dqx(2(n-1),1)} \\ v_{dqy(2(b-n+1),1)} \end{bmatrix} =$$

$$\begin{bmatrix} 0_{(2(n-1),2(n-1))} & -\hat{A}_{dq(2(n-1),2(b-n+1))} & 0_{(2(n-1),2(n-1))} & 0_{(2(n-1),2(b-n+1))} \\ 0_{(2(b-n+1),2(n-1))} & G_{dq(2(b-n+1),2(b-n+1))} & 0_{(2(b-n+1),2(n-1))} & E_{dq(2(b-n+1),2(b-n+1))} \\ F_{dq(2(n-1),2(n-1))} & 0_{(2(n-1),2(b-n+1))} & H_{dq(2(n-1),2(n-1))} & 0_{(2(n-1),2(b-n+1))} \\ 0_{(2(b-n+1),2(n-1))} & 0_{(2(b-n+1),2(b-n+1))} & \hat{A}^T_{dq(2(b-n+1),2(n-1))} & 0_{(2(b-n+1),2(b-n+1))} \end{bmatrix} \begin{bmatrix} i_{dqy(2(n-1),1)} \\ i_{dqx(2(b-n+1),1)} \\ v_{dqx(2(n-1),1)} \\ v_{dqy(2(b-n+1),1)} \end{bmatrix} +$$

$$\begin{bmatrix} 0_{(2(n-1),2ni)} & 0_{(2(n-1),2nv)} \\ b_{dqi(2(b-n+1),2ni)} & 0_{(2(b-n+1),2nv)} \\ 0_{(2(n-1),2ni)} & b_{dqv(2(n-1),2nv)} \\ 0_{(2(b-n+1),2ni)} & 0_{(2(b-n+1),2nv)} \end{bmatrix} \begin{bmatrix} u_{dq(2ni,1)} \\ u_{dq(2nv,1)} \end{bmatrix}$$

Eq. (9) is similar to Eq. (4), with the difference lying in the size of the DQ equations. Specifically, a relationship between the number of equations and the number of states can be set forth as follows (as indicated above with respect to Eq. (1)): $2(N_{max}+1)M$. This is due to each DQ equation being represented by both the amplitude of a cosine signal (d-axis) and a specific frequency and the amplitude of a negative sine signal (q-axis) at the specific frequency.

To generate DQ equations, the DQ transfer function generator component 304 can define each sub-matrix from Eq. (9). The DQ transfer function generator component 304 can generate $\hat{A}_{dq}$, $E_{dq}$, and $F_{dq}$, using equations $\hat{A}$, E, and F, respectively, from Eq. (4). Specifically, multiplying each individual entry in $\hat{A}$, E, and F by a 2×2 identity matrix can generate $\hat{A}_{dq}$, $E_{dq}$, and $F_{dq}$.

It can also be ascertained that Eq. (9) adds the $G_{dq}$ and $H_{dq}$ matrices. Such matrices represent a cross-coupling between the d-axis and q-axis equations, which occurs at energy storage elements in the circuits (this cross-coupling is why many DQ-controlled inverters have a ±ωL decoupling term, just before generating the commanded output voltage). Cross coupling terms can also be added to the existing $E_{dq}$ and $F_{dq}$ matrices. $G_{dq}$ includes exclusively cross-coupling terms for the independent branch currents. $H_{dq}$ includes exclusively cross-coupling terms for the independent branch voltages. Addition of the cross-coupling terms to Eq. (9) are illustrated in FIGS. 8 and 9, respectively.

Figure 8:
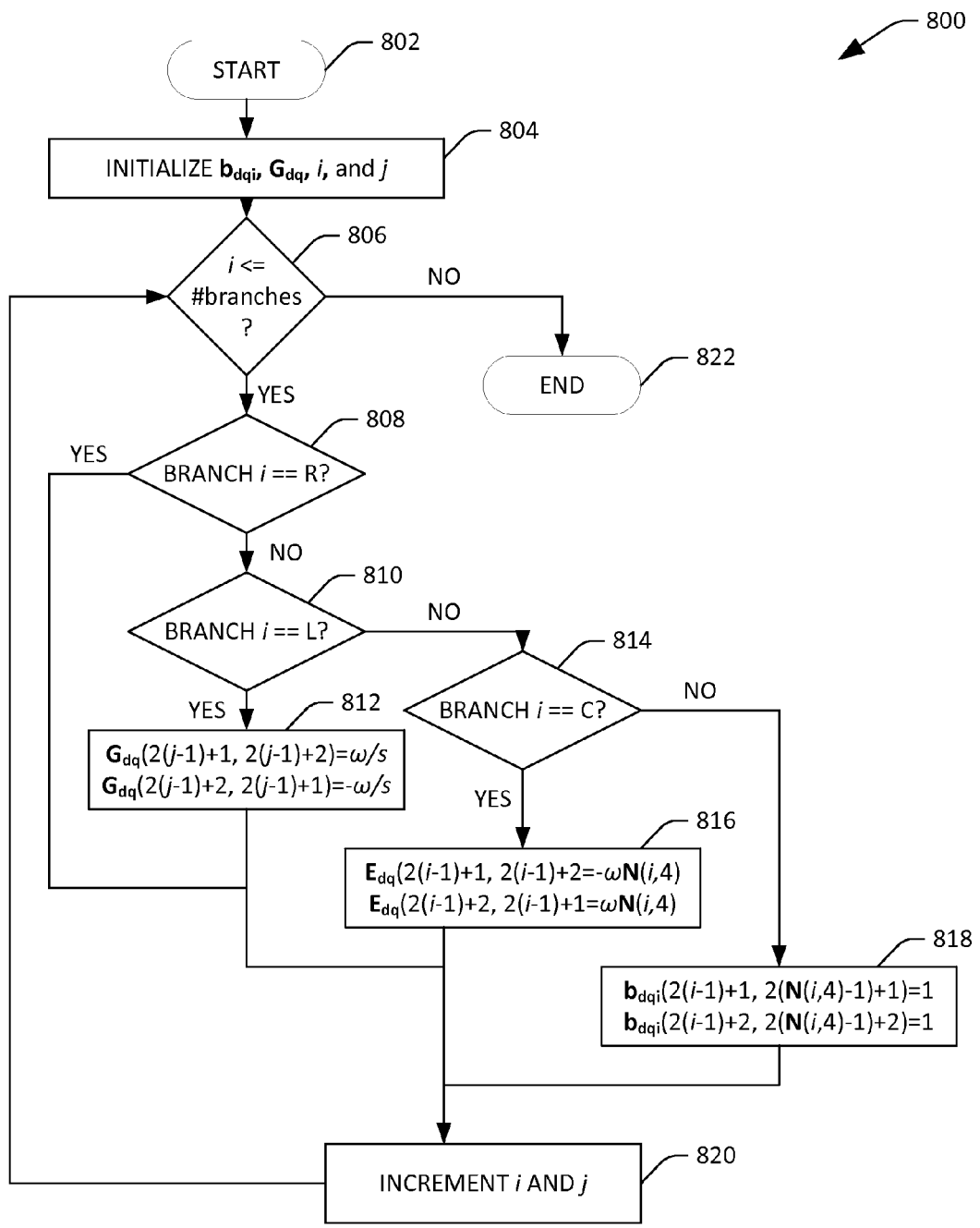
Figure 9:
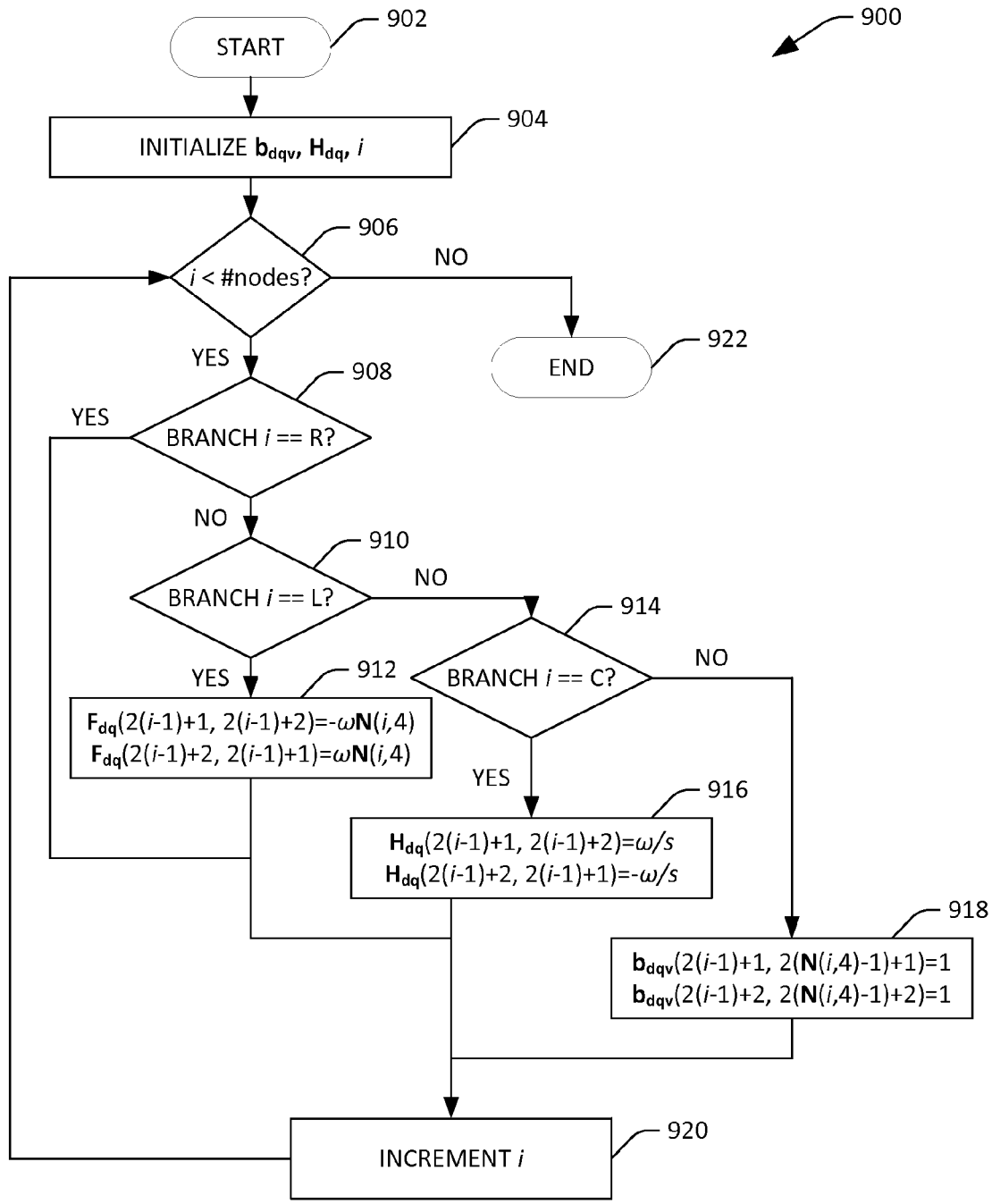

Referring solely to FIG. 8, an exemplary methodology 800 that can be performed by the DQ transfer function generator component 304 in connection with defining $G_{dq}$, $E_{dq}$, and $b_{dqi}$; is illustrated. The methodology 800 starts at 802, and at 804 $b_{dqi}$, $G_{dq}$, i, and i are initialized. For instance, $b_{dqi}$ and $G_{dq}$ can be set to zero, i can be set to the number of nodes in N, and j can be set to one.

At 806, a determination is made as to whether i is less than or equal to the number of branches in N. If i is less than or equal to the number of branches in N, then the methodology 800 proceeds to 808, where a determination is made as to whether branch i in N represents a resistor. If it is determined that branch i in N does not represent a resistor, than the methodology 800 proceeds to 810, where a determination is made as to whether branch i in N represents an inductor. If it is determined that branch i represents an inductor, the methodology 800 proceeds to 812, where $G_{dq}(2(j-1)+1, 2(j-1)+2)=\omega/s$, $G_{dq}(2(j-1)+2, 2(j-1)+1)=-\omega/s$ and where ω is a frequency set forth by the user. For example, if the user desires to analyze the physical system at DC, 60 Hz, 120 Hz, and 180 Hz, there will be one equation in the form of Eq. (4) and three equations in the form of Eq. (9). One of such equations will have $\omega=2\pi 60$, one will have $\omega=2\pi 120$, and one will have $\omega=2\pi 180$. Since circuits for which transfer functions are to be generated by the DC transfer function generator component 302 and the DQ transfer function generator component 304 are linear, there is no transfer between the DC, 60 Hz, 120 Hz, and 180 Hz circuits. Transfer properties can be considered when processing the system level netlist.

If at 810 it is determined that branch i of N does not represent an inductor, than the methodology 800 proceeds to 814, where a determination is made regarding whether branch i of N represents a capacitor. If it is determined that the branch i of N represents a capacitor, the methodology 800 proceeds to 816, where $E_{dq}(2(i-1)+1, 2(i-1)+2=-\omega N(i,4)$, and $E_{dq}(2(i-1)+2, 2(i-1)+1=\omega N(i,4)$.

If it is determined at 816 that branch i of N does not represent a capacitor (thus, branch i represents a voltage source), then the methodology 800 proceeds to 818, where $b_{dqi}(2(i-1)+1, 2(N(i,4)-1)+1)=1$, and $b_{dqi}(2(i-1)+2, 2(N(i,4)-1)+2)=1$. If at 808 it is determined that the branch i of the netlist represents a resistor, or subsequent to acts 812, 816 or 818, the methodology 800 proceeds to 820, where i and j are incremented. Thereafter, the methodology 800 returns to act 806. If it is determined at act 806 that the value for i is not less than or equal to the number of branches in N, then the methodology 800 completes at 822.

Now referring to FIG. 9, an exemplary methodology 900 that can be executed by the DQ transfer function generator component 304 in connection with setting values for $H_{dq}$, $b_{dqv}$, and $F_{dq}$ is illustrated. The methodology 900 starts at 902, and at 904, $H_{dq}$, $b_{dqv}$, and i are initialized. For instance, $H_{dq}$ and $b_{dqv}$ can be set to zero when initialized, while i can be set to one. At 906, a determination is made regarding whether i is less than the number of nodes represented in N. If it is found that i is less than the number of nodes in N, then the methodology 900 proceeds to 908, where a determination is made as to whether branch i in N represents a resistor. If it is found at 908 that branch does not represents a resistor, than the methodology 900 proceeds to 910, where a determination is made regarding whether the branch i of N represents an inductor. If it is determined that the branch i represents an inductor, than the methodology 900 proceeds to 912, where $F_{dq}(2(i-1)+1, 2(i-1)+2)=-\omega N(i,4)$, and $F_{dq}(2(i-1)+2, 2(i-1)+1)=\omega N(i,4)$. If at 910 it is determined that branch i of N does not represent an inductor, then the methodology 900 proceeds to 914, where a determination is made regarding whether branch i of N represents a capacitor. If it is found that branch i of N represents a capacitor, then the methodology 900 proceeds to 916, where $H_{dq}(2(i-1)+1, 2(i-1)+2)=\omega/s$ and $H_{dq}(2(i-1)+2, 2(i-1)+1)=-\omega/s$. If it is found at 914 that branch i of N does not represent a capacitor (e.g., branch i of N represents a voltage source), then the methodology 900 proceeds to 918, where $b_{dqv}(2(i-1)+1, 2(N(i,4)-1)+1)=1$ and $b_{dqv}(2(i-1)+2, 2(N(i,4)-1)+2)=1$.

If at 908 it is determined that branch i of N represents a resistor, or subsequent to acts 912, 916, or 918, the methodology 900 proceeds to 920, where i is incremented. Thereafter, the methodology 900 returns to 906. If it is determined at 906 that i is not less than the number of nodes in the netlist, then the methodology 900 completes at 922.

Subsequent to computing the cross-coupling terms, the DQ transfer function generator component 304 can place such cross-coupling terms in Eq. (9), and can solve for the DQ transfer functions of the circuit. Such transfer functions can have a form as follows:

$$\frac{x}{u} = \begin{bmatrix} \frac{i_{1d}}{i_{ind(1)}} & \frac{i_{1d}}{i_{inq(1)}} & \frac{i_{1d}}{i_{ind(2)}} & \frac{i_{1d}}{i_{inq(2)}} & \cdots & \frac{i_{1d}}{i_{ind(ni)}} & \frac{i_{1d}}{i_{inq(ni)}} & \frac{i_{1d}}{v_{ind(1)}} & \frac{i_{1d}}{v_{inq(1)}} & \frac{i_{1d}}{v_{ind(2)}} & \frac{i_{1d}}{v_{inq(2)}} & \cdots & \frac{i_{1d}}{v_{ind(nv)}} & \frac{i_{1d}}{v_{ind(nv)}} \\ \frac{i_{1q}}{i_{ind(1)}} & \frac{i_{1q}}{i_{inq(1)}} & \frac{i_{1q}}{i_{ind(2)}} & \frac{i_{1q}}{i_{inq(2)}} & \cdots & \frac{i_{1q}}{i_{ind(ni)}} & \frac{i_{1q}}{i_{inq(ni)}} & \frac{i_{1q}}{v_{ind(1)}} & \frac{i_{1q}}{v_{inq(1)}} & \frac{i_{1q}}{v_{ind(2)}} & \frac{i_{1q}}{v_{inq(2)}} & \cdots & \frac{i_{1q}}{v_{ind(nv)}} & \frac{i_{1q}}{v_{ind(nv)}} \\ \frac{i_{2d}}{i_{ind(1)}} & \frac{i_{2d}}{i_{inq(1)}} & \frac{i_{2d}}{i_{ind(2)}} & \frac{i_{2d}}{i_{inq(2)}} &  & \frac{i_{2d}}{i_{ind(ni)}} & \frac{i_{2d}}{i_{inq(ni)}} & \frac{i_{2d}}{v_{ind(1)}} & \frac{i_{2d}}{v_{inq(1)}} & \frac{i_{2d}}{v_{ind(2)}} & \frac{i_{2d}}{v_{inq(2)}} &  & \frac{i_{2d}}{v_{ind(nv)}} & \frac{i_{2d}}{v_{ind(nv)}} \\ \frac{i_{2q}}{i_{ind(1)}} & \frac{i_{2q}}{i_{inq(1)}} & \frac{i_{2q}}{i_{ind(2)}} & \frac{i_{2q}}{i_{inq(2)}} &  & \frac{i_{2q}}{i_{ind(ni)}} & \frac{i_{2q}}{i_{inq(ni)}} & \frac{i_{2q}}{v_{ind(1)}} & \frac{i_{2q}}{v_{inq(1)}} & \frac{i_{2q}}{v_{ind(2)}} & \frac{i_{2q}}{v_{inq(2)}} &  & \frac{i_{2q}}{v_{ind(nv)}} & \frac{i_{2q}}{v_{ind(nv)}} \\ \vdots &  &  &  & \ddots & \vdots &  &  &  &  &  & \ddots & \vdots &  \\ \frac{i_{bd}}{i_{ind(1)}} & \frac{i_{bd}}{i_{inq(1)}} & \frac{i_{bd}}{i_{ind(2)}} & \frac{i_{bd}}{i_{inq(2)}} &  & \frac{i_{bd}}{i_{ind(ni)}} & \frac{i_{bd}}{i_{inq(ni)}} & \frac{i_{bd}}{v_{ind(1)}} & \frac{i_{bd}}{v_{inq(1)}} & \frac{i_{bd}}{v_{ind(2)}} & \frac{i_{bd}}{v_{inq(2)}} &  & \frac{i_{bd}}{v_{ind(nv)}} & \frac{i_{bd}}{v_{ind(nv)}} \\ \frac{i_{bq}}{i_{ind(1)}} & \frac{i_{bq}}{i_{inq(1)}} & \frac{i_{bq}}{i_{ind(2)}} & \frac{i_{bq}}{i_{inq(2)}} & \cdots & \frac{i_{bq}}{i_{ind(ni)}} & \frac{i_{bq}}{i_{inq(ni)}} & \frac{i_{bq}}{v_{ind(1)}} & \frac{i_{bq}}{v_{inq(1)}} & \frac{i_{bq}}{v_{ind(2)}} & \frac{i_{bq}}{v_{inq(2)}} & \cdots & \frac{i_{bq}}{v_{ind(nv)}} & \frac{i_{bq}}{v_{ind(nv)}} \\ \frac{v_{1d}}{i_{ind(1)}} & \frac{v_{1d}}{i_{inq(1)}} & \frac{v_{1d}}{i_{ind(2)}} & \frac{v_{1d}}{i_{inq(2)}} &  & \frac{v_{1d}}{i_{ind(ni)}} & \frac{v_{1d}}{i_{inq(ni)}} & \frac{v_{1d}}{v_{ind(1)}} & \frac{v_{1d}}{v_{inq(1)}} & \frac{v_{1d}}{v_{ind(2)}} & \frac{v_{1d}}{v_{inq(2)}} &  & \frac{v_{1d}}{v_{ind(nv)}} & \frac{v_{1d}}{v_{ind(nv)}} \\ \frac{v_{1q}}{i_{ind(1)}} & \frac{v_{1q}}{i_{inq(1)}} & \frac{v_{1q}}{i_{ind(2)}} & \frac{v_{1q}}{i_{inq(2)}} & \cdots & \frac{v_{1q}}{i_{ind(ni)}} & \frac{v_{1q}}{i_{inq(ni)}} & \frac{v_{1q}}{v_{ind(1)}} & \frac{v_{1q}}{v_{inq(1)}} & \frac{v_{1q}}{v_{ind(2)}} & \frac{v_{1q}}{v_{inq(2)}} & \cdots & \frac{v_{1q}}{v_{ind(nv)}} & \frac{v_{1q}}{v_{ind(nv)}} \\ \frac{v_{2d}}{i_{ind(1)}} & \frac{v_{2d}}{i_{inq(1)}} & \frac{v_{2d}}{i_{ind(2)}} & \frac{v_{2d}}{i_{inq(2)}} &  & \frac{v_{2d}}{i_{ind(ni)}} & \frac{v_{2d}}{i_{inq(ni)}} & \frac{v_{2d}}{v_{ind(1)}} & \frac{v_{2d}}{v_{inq(1)}} & \frac{v_{2d}}{v_{ind(2)}} & \frac{v_{2d}}{v_{inq(2)}} &  & \frac{v_{2d}}{v_{ind(nv)}} & \frac{v_{2d}}{v_{ind(nv)}} \\ \frac{v_{2q}}{i_{ind(1)}} & \frac{v_{2q}}{i_{inq(1)}} & \frac{v_{2q}}{i_{ind(2)}} & \frac{v_{2q}}{i_{inq(2)}} &  & \frac{v_{2q}}{i_{ind(ni)}} & \frac{v_{2q}}{i_{inq(ni)}} & \frac{v_{2q}}{v_{ind(1)}} & \frac{v_{2q}}{v_{inq(1)}} & \frac{v_{2q}}{v_{ind(2)}} & \frac{v_{2q}}{v_{inq(2)}} &  & \frac{v_{2q}}{v_{ind(nv)}} & \frac{v_{2q}}{v_{ind(nv)}} \\ \vdots &  &  &  & \ddots & \vdots &  &  &  &  &  & \ddots & \vdots &  \\ \frac{v_{bd}}{i_{ind(1)}} & \frac{v_{bd}}{i_{inq(1)}} & \frac{v_{bd}}{i_{ind(2)}} & \frac{v_{bd}}{i_{inq(2)}} &  & \frac{v_{bd}}{i_{ind(ni)}} & \frac{v_{bd}}{i_{inq(ni)}} & \frac{v_{bd}}{v_{ind(1)}} & \frac{v_{bd}}{v_{inq(1)}} & \frac{v_{bd}}{v_{ind(2)}} & \frac{v_{bd}}{v_{inq(2)}} &  & \frac{v_{bd}}{v_{ind(nv)}} & \frac{v_{bd}}{v_{ind(nv)}} \\ \frac{v_{bq}}{i_{ind(1)}} & \frac{v_{bq}}{i_{inq(1)}} & \frac{v_{bq}}{i_{ind(2)}} & \frac{v_{bq}}{i_{inq(2)}} & \cdots & \frac{v_{bq}}{i_{ind(ni)}} & \frac{v_{bq}}{i_{inq(ni)}} & \frac{v_{bq}}{v_{ind(1)}} & \frac{v_{bq}}{v_{inq(1)}} & \frac{v_{bq}}{v_{ind(2)}} & \frac{v_{bq}}{v_{inq(2)}} & \cdots & \frac{v_{bq}}{v_{ind(nv)}} & \frac{v_{bq}}{v_{ind(nv)}} \end{bmatrix} \quad (10)$$

where the numerator in each entry represents either the current through a branch or the voltage across the branch. The branch number is specified by the subscript of the numerator (with b representing the number of branches in the circuit). The d or q subscript specifies that the output is in the d-axis or q-axis. The denominator in each entry represents an input current or voltage. The input source number is specified by the subscript in parentheses (with ni representing the number of current sources in the circuit and nv representing the number of voltage sources in the circuit). The d and q subscripts indicate whether the input is in the d-axis or q-axis.

The system transfer function generator component 306 can compute transfer functions that specify how circuits interact with one another, and further specifies how circuits interact with controllers. Such transfer functions can be computed based upon a high level netlist, which indicates, for each current source and each voltage source, whether a respective current source is a constant current source or a controlled current source and whether a respective voltage source is a constant voltage source of a controlled voltage source. The system level netlist can also include data that identifies a type of control system used for each controlled current/voltage source.

Figure 10:
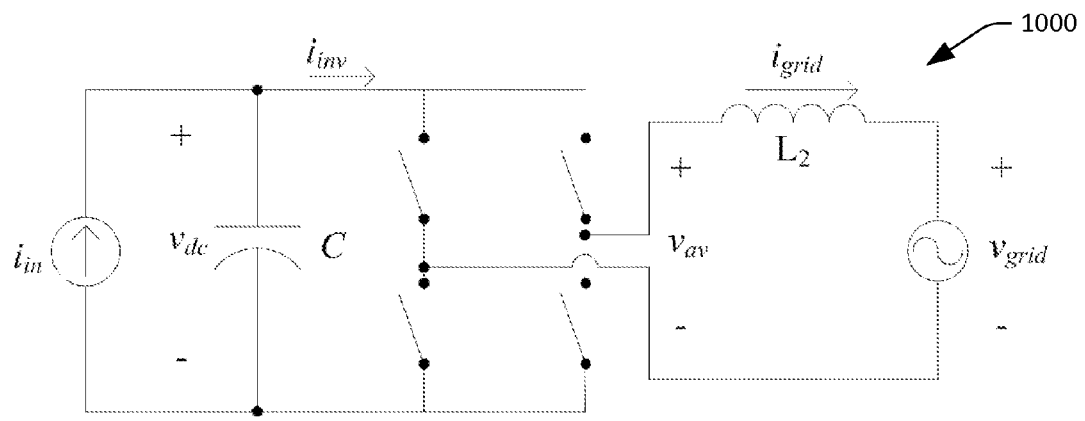
FIG. 10 illustrates an exemplary inverter circuit.
Figure 12:
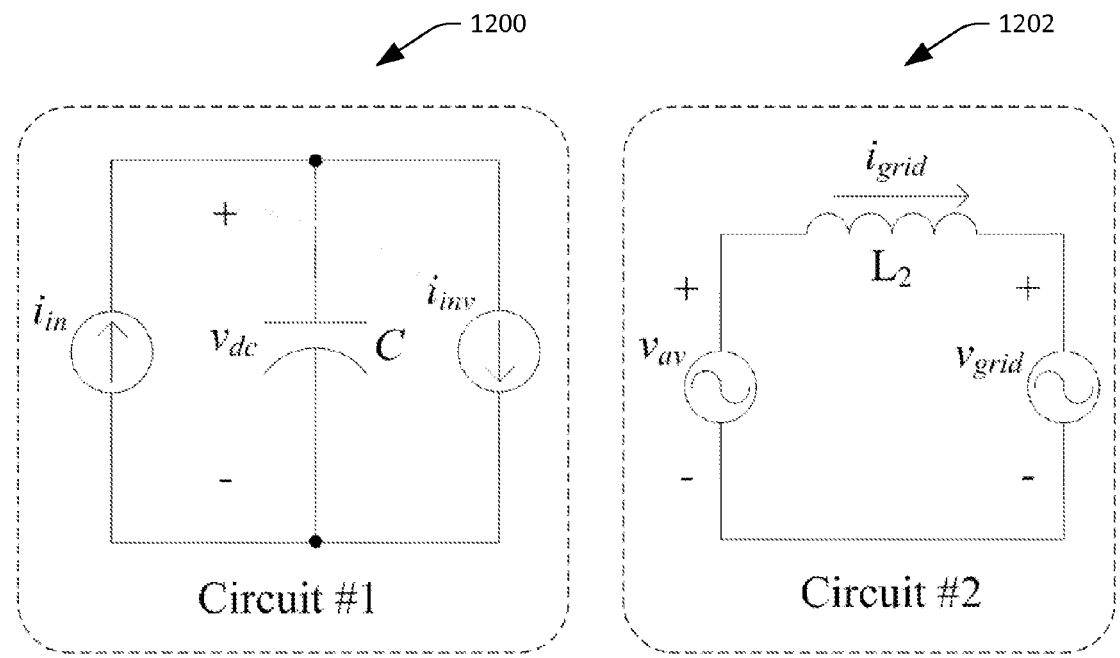
FIG. 12 depicts an averaged model inverter circuit that is equivalent to the circuit shown in FIG. 10.
Figure 11:
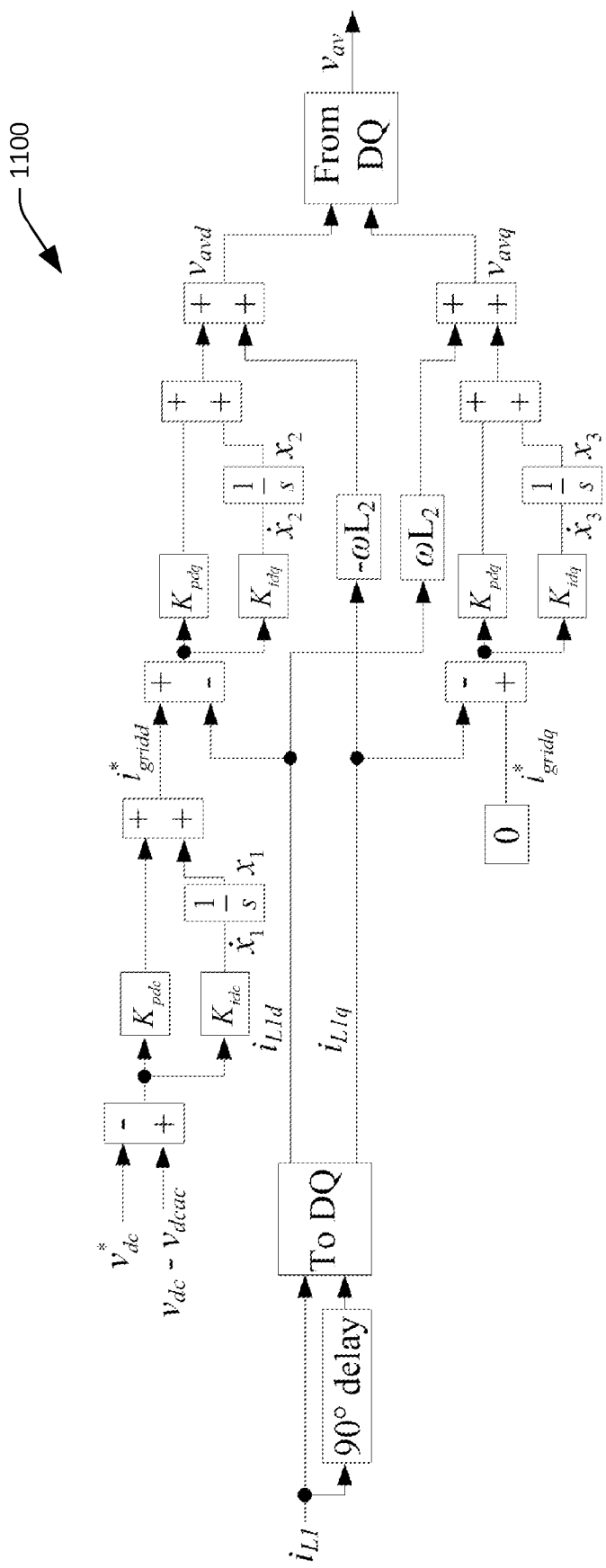
FIG. 11 illustrates an exemplary controller for the inverter circuit shown in FIG. 10.

With reference to FIG. 10, an exemplary circuit 1000 is illustrated. FIG. 11 depicts an exemplary controller 1100 that can be employed to control the circuit 1000. Together, the circuit 1000 and the controller 1100 can represent a grid-tied, single-phase inverter that utilizes DQ current control. To model such circuit using the techniques described above, the circuit 1000 can be split into two (average model) circuits, as shown in FIG. 12. Specifically, FIG. 12 includes a first circuit 1200 and a second circuit 1202, which represents the circuit 1000 shown in FIG. 10. It is not shown in FIGS. 10-12 how i inv is derived. Such current can be found using instantaneous power as follows:

$$i_{inv} = \frac{v_{av}i_L}{v_{dc}} \qquad (11)$$

The transfer functions describing the circuits 1200 and 1202 can be generated by the DC transfer function generator component 302 and the DQ transfer function generator component 304, as described above. Accordingly, a system-level netlist that takes into consideration the controller can include the set of transfer functions generated from the circuit netlist(s), system inputs, transfer functions (different from those generated by the components 302 and 304), multiplication, inversion, delay, from DQ, and to DQ.

Figure 13:
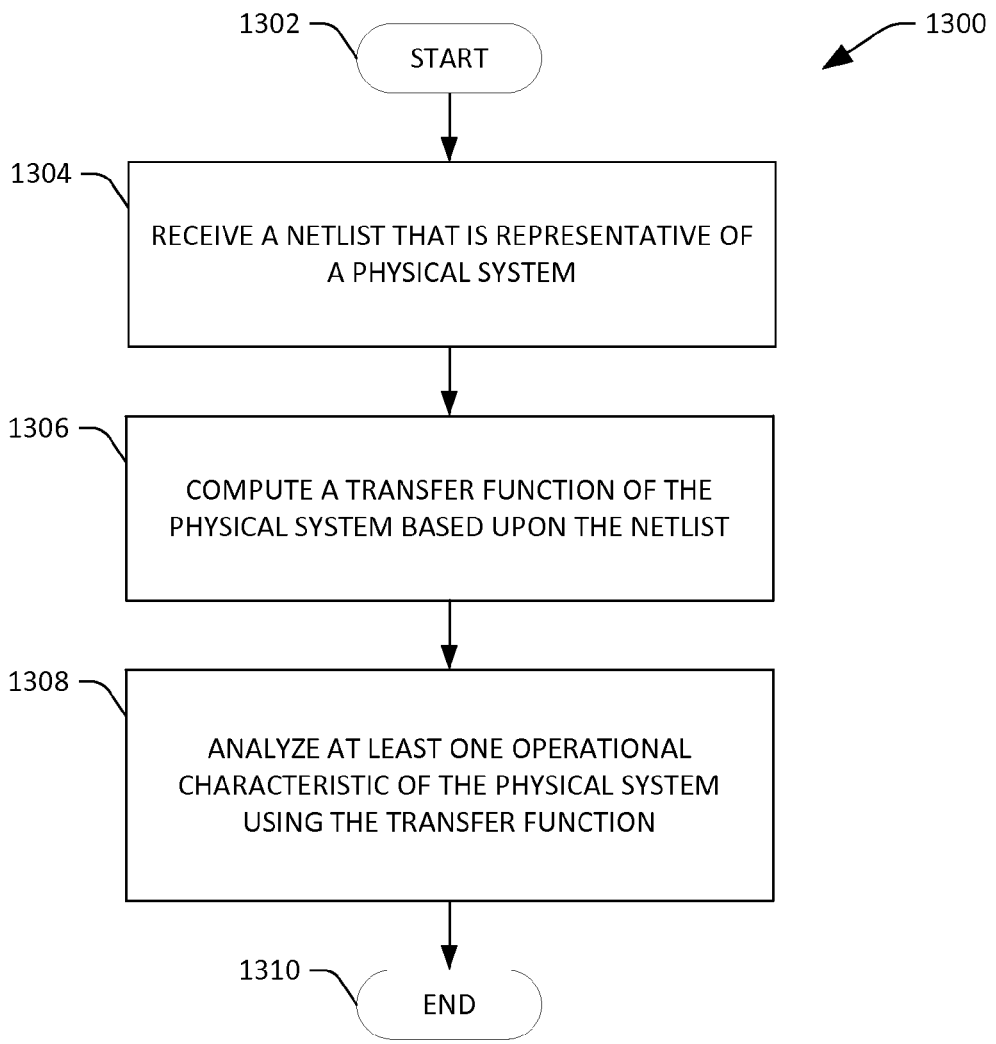
FIG. 13 is a flow diagram illustrating an exemplary methodology for computing a transfer function of a physical system and analyzing at least one operational characteristics of the physical system using the derived transfer function.

With reference now to FIG. 13, an exemplary methodology 1300 that facilitates analyzing at least one operational characteristic of a physical system is illustrated. The methodology 1300 starts at 1302, and at 1304 a netlist that is representative of a physical system is received, wherein the physical system can be an electrical system, a mechanical system, an electromechanical system, an electrochemical system, or an electromagnetic system. As noted above, the netlist includes data that is indicative of types of elements and respective values for the elements in the physical system. In a particular example, the netlist can be representative of an electrical system that is coupled to an energy storage device.

At 1306, a transfer function of the physical system is computed based upon the netlist. Such computation can occur responsive to receipt of the netlist at 1304. At 1308, at least one operational characteristic of the physical system is analyzed, wherein analysis of the operational characteristic of the system comprises outputting graphical data to a display screen that is indicative of the at least one operational characteristic. In an example, the netlist can be representative of an electrical system that is coupled to an energy storage device. Accordingly, analyzing the at least one operational characteristic of the electrical system can comprise identifying a resonant frequency corresponding to the electrical system. It is further to be ascertained that at 1306 a plurality of transfer functions of the electrical system can be computed, wherein the plurality of transfer functions comprise at least one of an input-to-output transfer function, a control-to-output transfer function, an input impedance transfer function, or an output impedance transfer function. The methodology 1300 completes at 1310.

Figure 14:
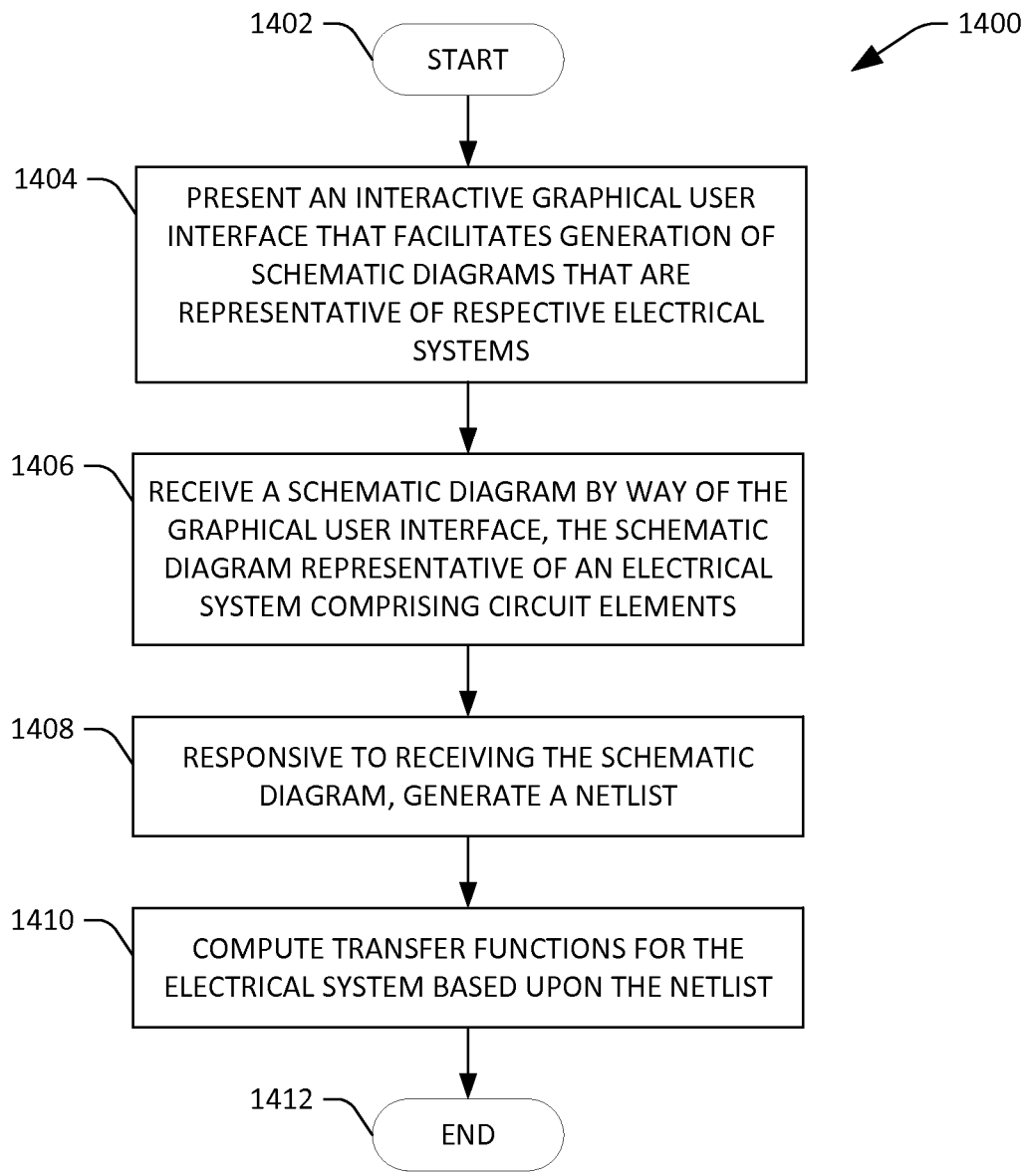
FIG. 14 is a flow diagram that illustrates an exemplary methodology for computing transfer functions for an electrical system based upon an automatically generated netlist that describes contents of the system.

With reference now to FIG. 14, an exemplary methodology 1400 that facilitates computing transfer functions for an electrical system is illustrated. The methodology 1400 starts at 1402, and at 1404 an interactive graphical user interface is presented to a user, wherein the interactive graphical user interface facilitates generation of schematic diagrams that are representative of respective electrical systems. Accordingly, the user can generate a schematic diagram of an electrical system by coupling together elements to form nodes and branches.

At 1406, a schematic diagram is received by way of the interactive graphical user interface, wherein the schematic diagram is representative of an electrical system comprising circuit elements. Such circuit elements may include resistors, inductors, capacitors, voltage sources, and/or current sources. Optionally, the circuit elements can include control system elements. At 1408, responsive to receiving the schematic diagram at 1406, a netlist is automatically generated, wherein the netlist comprises values that are indicative of the respective types of the circuit elements and the structure of the electrical system. Furthermore, the netlist can include values for parameters of the elements including resistance values, capacitance values, etc.

At 1410, transfer functions for the electrical system are computed based upon the netlist generated at 1408. The methodology 1400 completes at 1412.

Figure 15:
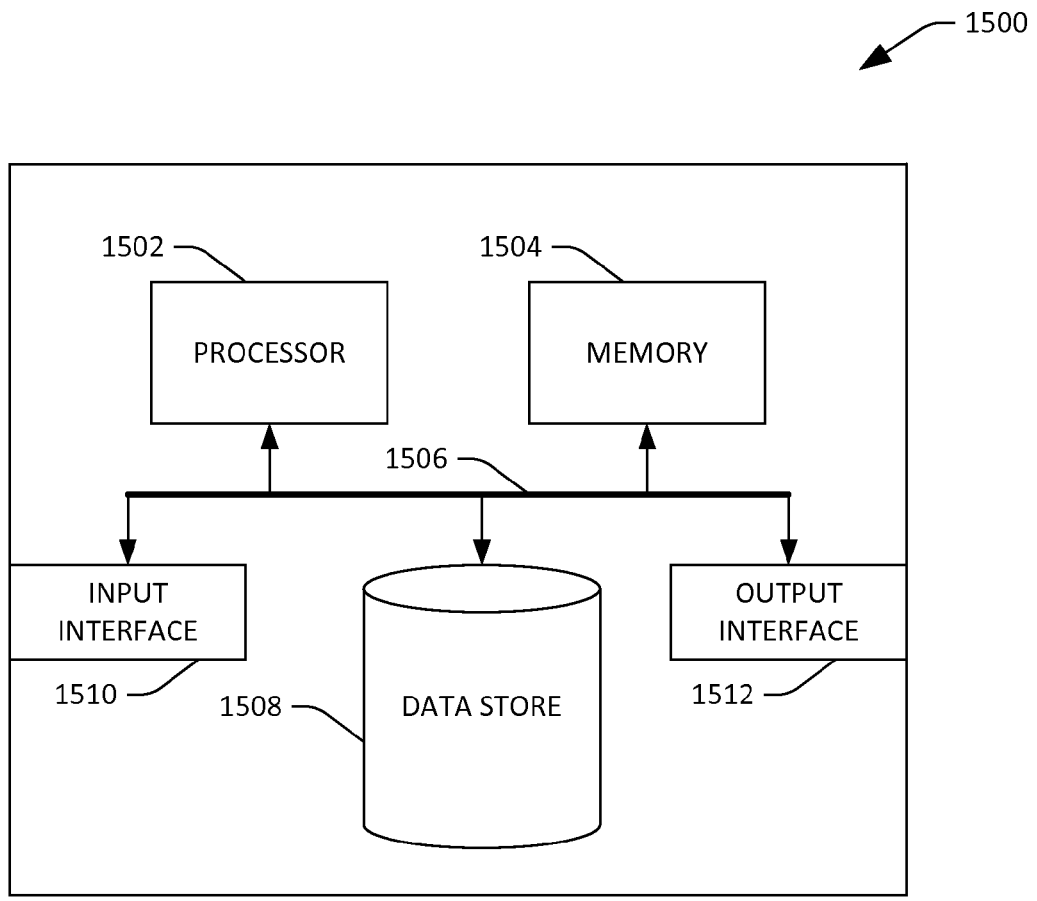
FIG. 15 is an exemplary computing system.

Referring now to FIG. 15, a high-level illustration of an exemplary computing device 1500 that can be used in accordance with the tools, systems, and methodologies disclosed herein is illustrated. For instance, the computing device 1500 may be used in connection with a tool that computes sub-system-level transfer functions. By way of another example, the computing device 1500 can be used in connection with a tool that computes system-level transfer functions, wherein a physical system includes a controller. The computing device 1500 includes at least one processor 1502 that executes instructions that are stored in a memory 1504. The instructions may be, for instance, instructions for implementing functionality described as being carried out by one or more components discussed above or instructions for implementing one or more of the methods described above. The processor 1502 may access the memory 1504 by way of a system bus 1506. In addition to storing executable instructions, the memory 1504 may also store netlists, schematic system diagrams, etc.

The computing device 1500 additionally includes a data store 1508 that is accessible by the processor 1502 by way of the system bus 1506. The data store 1508 may include executable instructions, netlists, schematic system diagrams, etc. The computing device 1500 also includes an input interface 1510 that allows external devices to communicate with the computing device 1500. For instance, the input interface 1510 may be used to receive instructions from an external computer device, from a user, etc. The computing device 1500 also includes an output interface 1512 that interfaces the computing device 1500 with one or more external devices. For example, the computing device 1500 may display text, images, etc. by way of the output interface 1512.

It is contemplated that the external devices that communicate with the computing device 1500 via the input interface 1510 and the output interface 1512 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 1500 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 1500 may be a distributed system. Thus, for instance, several devices may be in communication by way of a network connection and may collectively perform tasks described as being performed by the computing device 1500.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method executed by a processor of a computing device, the method comprising:
   receiving a netlist that is representative of a physical system, the netlist comprising data that is indicative of types of elements and respective values for the elements in the physical system, the physical system being one of an electrical system, an electromechanical system, an electrochemical system, a mechanical system, or an electromagnetic system;
   responsive to receiving the netlist, computing a transfer function for the physical system based at least in part upon the data that is indicative of the types of the elements and the respective values for the elements; and
   analyzing at least one operational characteristic of the physical system based at least in part upon the transfer function and at least partially based on a direct-quadrature transfer function generator component, wherein the analyzing comprises outputting graphical data to a display screen that is indicative of the at least one operational characteristic.

2. The method of claim 1, wherein the physical system being an electrical system, the electrical system coupled to an energy storage device, and wherein the analyzing the at least one operational characteristic of the electrical system comprises identifying a resonant frequency of the electrical system.

3. The method of claim 1, further comprising:
   displaying a plurality of selectable system elements;
   receiving user commands, the user commands selecting and arranging the selectable system elements to represent the physical system; and
   computing the netlist based upon the user commands.

4. The method of claim 1, wherein a plurality of transfer functions are computed for the physical system.

5. The method of claim 4, wherein the plurality of transfer functions comprises at least one of an input-to-output transfer function, a control-to-output transfer function, an input impedance transfer function, or an output impedance transfer function.

6. The method of claim 4, wherein the physical system comprises a circuit, and wherein computing the plurality of transfer functions comprises computing at least one transfer function for the circuit.

7. The method of claim 6, wherein the computing at least one transfer function for the circuit comprises computing a direct current transfer function for the circuit.

8. The method of claim 1, further comprising:
   receiving an indication of a frequency at which the operational characteristic is to be analyzed; and
   computing the transfer function based upon the indication of the frequency.

9. The method of claim 1, the physical system being an electrical system, the netlist formed as a matrix, wherein each row of the matrix comprises data that is indicative of a type of a respective element, a node to which a positive terminal of the respective element is attached, a node to which a negative terminal of the respective element is attached, and a value for the respective element.

10. The method of claim 9, wherein rows of the netlist are arranged based upon types of elements in the electrical system represented in the netlist.

11. The method of claim 1, wherein the physical system comprises a controller, and wherein the transfer function at least partially represents an impact of the controller on output of the physical system.

12. A computing device that facilitates computation of transfer functions, the computing device comprising:
   a processor module; and
   a memory module that comprises a plurality of components that are executed by the processor module, the plurality of components comprising:
   a receiver component that receives a netlist, the netlist comprising data that is indicative of elements of an electrical system and structure of the electrical system; and
   a transfer function deriver component that computes a transfer function of the electrical system based at least in part upon the netlist and at least partially based on a direct-quadrature transfer function generator component.

13. The computing device of claim 12, the plurality of components further comprising a netlist generator component that receives a schematic diagram of the electrical system and generates the netlist based upon the schematic diagram of the electrical system.

14. The computing device of claim 13, wherein the netlist generator component further receives values for the elements of the electrical system, the transfer function deriver component computes the transfer function of the electrical system based at least in part upon the values for the elements of the electrical system.

15. The computing device of claim 12, wherein the electrical system comprises a control circuit.

16. The computing device of claim 12, the plurality of components further comprising a system analyzer component that receives the transfer function for the electrical system and a measured input to the electrical system in a frequency domain, the system analyzer component applies the transfer function to the measured input to generate a corresponding output of the electrical system in the frequency domain.

17. The computing device of claim 16, the plurality of components further comprising a display component that displays graphical data that is indicative of the output of the electrical system in the frequency domain.

18. The computing device of claim 12, wherein the transfer function is one of an input-to-output transfer function, a control-to-output transfer function, an input impedance transfer function, or an output impedance transfer function.

19. The computing device of claim 12, wherein the receiver component receives an update to the netlist, and wherein the transfer function deriver component computes a new transfer function for the electrical system based upon the update to the netlist.

20. A non-transitory computer-readable storage medium comprising instructions that, when executed by a processor, cause the processor to perform acts comprising:
    presenting an interactive graphical user interface that facilitates generation of schematic diagrams that are representative of respective electrical systems;
    receiving a schematic diagram by way of the interactive graphical user interface, the schematic diagram representative of an electrical system comprising circuit elements;
    receiving a frequency at which the electrical system is to be analyzed;
    responsive to receiving the schematic diagram, generating a netlist that comprises values that are indicative of respective types of the circuit elements and structure of the electrical system; and
    computing transfer functions for the electrical system for the received frequency based upon the netlist and at least partially based on a direct-quadrature transfer function generator component.

* * * * *